United States Patent
Shyr

(10) Patent No.: US 6,672,793 B2
(45) Date of Patent: Jan. 6, 2004

(54) COMBINING DEVICE FOR COMBINING STACKED PLATES FLATLY

(76) Inventor: Daniel Shyr, 235 Chung - Ho Box 8-24, Taipei (TW)

( * ) Notice: Subject to any disclaimer, the term of this patent is extended or adjusted under 35 U.S.C. 154(b) by 0 days.

(21) Appl. No.: 10/054,398

(22) Filed: Jan. 24, 2002

(65) Prior Publication Data

US 2002/0168218 A1 Nov. 14, 2002

(30) Foreign Application Priority Data

May 9, 2001 (TW) ...................................... 90207506 U

(51) Int. Cl.$^7$ ................................................. F16B 5/00
(52) U.S. Cl. ...................... 403/324; 361/683; 312/111; 403/410
(58) Field of Search ............................. 403/321, 322.1, 403/322.4, 324, 331, 11; 24/573.19, 573.11, 596.1, DIG. 37; 312/111, 140, 223.2; 361/683

(56) References Cited

U.S. PATENT DOCUMENTS

| | | | | | |
|---|---|---|---|---|---|
| 3,023,065 A | * | 2/1962 | Marano | ...................... | 312/111 |
| 3,081,717 A | * | 3/1963 | Yurevich | ................ | 312/111 X |
| 3,403,641 A | * | 10/1968 | Baker | ...................... | 312/111 X |
| 3,446,544 A | * | 5/1969 | Serwer | ........................ | 312/111 |
| 3,675,955 A | * | 7/1972 | Hajduk | ................... | 312/111 X |
| 3,748,006 A | * | 7/1973 | Levit et al. | ................. | 312/111 |
| 4,148,454 A | * | 4/1979 | Carlson et al. | ......... | 312/111 X |
| 4,217,012 A | * | 8/1980 | Klaus | | |
| 5,784,251 A | * | 7/1998 | Miller et al. | ................. | 361/683 |
| 5,917,696 A | * | 6/1999 | Peng | | |
| 5,967,633 A | * | 10/1999 | Jung | ........................ | 312/223.2 |
| 6,002,586 A | * | 12/1999 | Chen et al. | .......... | 312/223.2 X |
| 6,266,237 B1 | * | 7/2001 | Jensen et al. | ................ | 361/683 |
| 6,373,695 B1 | * | 4/2002 | Cheng | .................. | 312/223.2 X |
| 6,392,874 B1 | * | 5/2002 | Gan | ............................ | 361/683 |
| 6,396,686 B1 | * | 5/2002 | Liu et al. | ............. | 312/223.2 X |
| 6,483,710 B1 | * | 11/2002 | Reasoner et al. | | |
| 6,496,363 B1 | * | 12/2002 | Li | ........................... | 361/683 X |

* cited by examiner

Primary Examiner—Lynne H. Browne
Assistant Examiner—Ryan M. Flandro

(57) ABSTRACT

The combining device for combining stacked plates includes a first plate at a bottom layer thereof, a plurality of upper plates, and an inserting means. The first plate is formed with at least two buckling rings; and a proper distance is retained between the two buckling rings. The upper plate is formed with at least one hole at position corresponding to one of the buckling rings. The buckling rings is inserted by the two inserting ends of each inserting means; and then the elastic pieces aside the inserting end pass through the buckling ring and resists against the inserting end. Thereby, the plates are combined, while the inserting end can not be released. Therefore, the combining device of the present invention provides a low cost and conventional way for combining a plurality of overlapping plates. Moreover, by the present invention, the combining surface is flat.

4 Claims, 5 Drawing Sheets

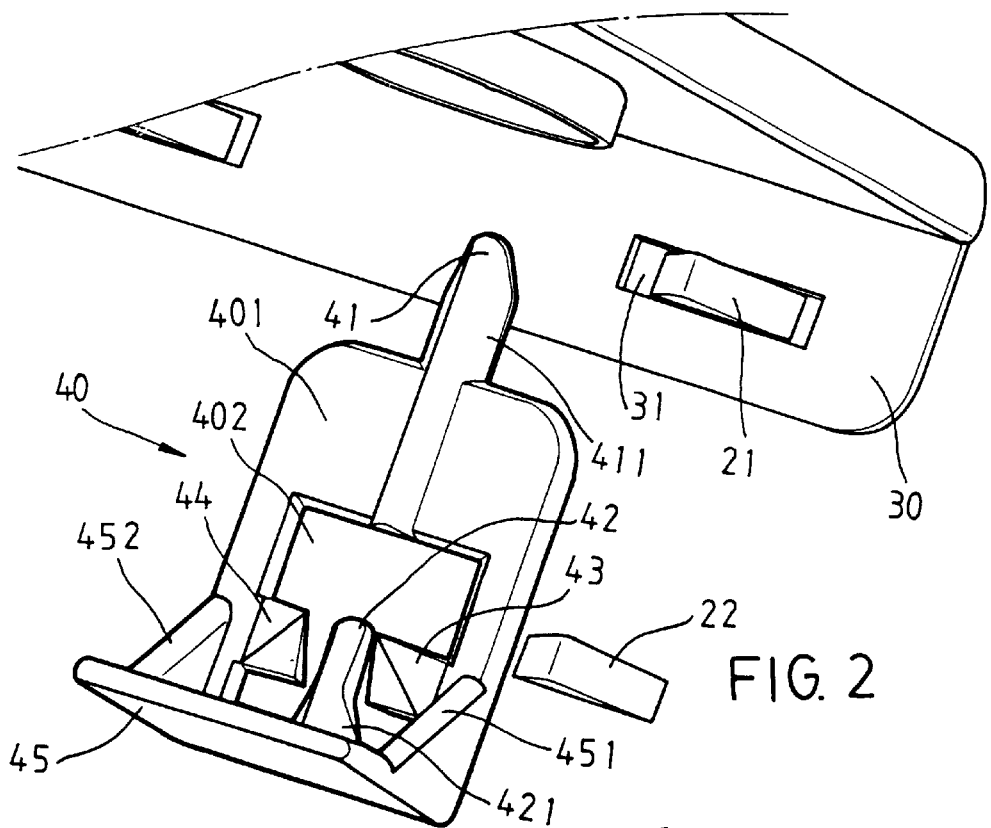
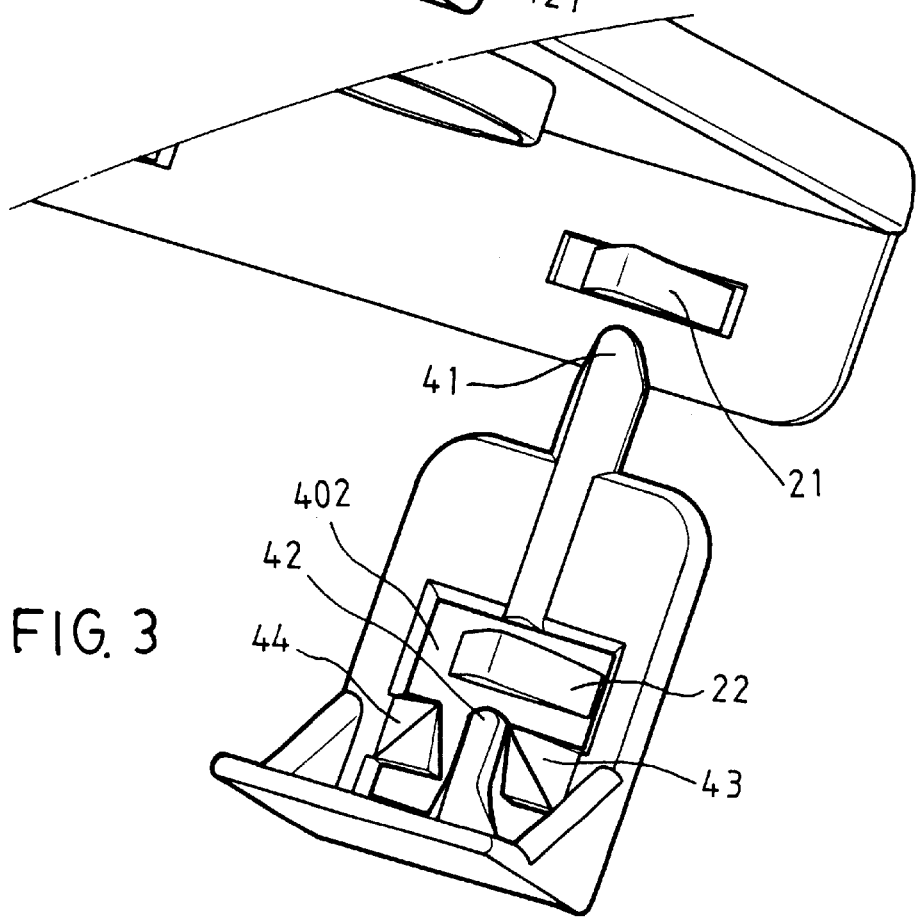

COMBINING DEVICE FOR COMBINING STACKED PLATES FLATLY

FIELD OF THE INVENTION

The present invention relates to combining devices, and especially to a combining device for combining a plurality of stacked plates flatly.

BACKGROUND OF THE INVENTION

In general, a plurality of plates are combined by nails, screws or rivets.

Referring to FIG. 1, it is illustrated that two plates 11, 12 are combined by rivets. However, this prior way will leave a protruded combining portion 101 from the outer surface of the plate 12 so as to affect the flatness of the plates.

For example, to combine frames or other devices in the assembly of a personal computer, a combining technology for combining plates is used. Thereby, protrusion is formed at the combining portion 101. This protrusion not only affects the appearance of the casing, but also will collide with other devices. Furthermore, in assembly, it will induce an inconvenience. Moreover, it is inconvenient in repairing a computer.

SUMMARY OF THE INVENTION

Accordingly, the primary object of the present invention is to provide combining device, wherein the combining device of the present invention improves the defects of the conventional way for combining stacked plates. Furthermore, the cost of the present invention is low and the present invention can be assembled easily. Moreover, by the present invention, the combining surface is flat.

To achieve the object, the present invention provides a combining device for stacked plates. The combining device includes a first plate at a bottom layer thereof, a plurality of upper plates, and an inserting means. The first plate is formed with at least two buckling rings; a proper distance is retained between the two buckling rings. The upper plate is formed with at least one hole at position corresponding to one of the buckling rings. Two inserting ends of each inserting means inserts into the buckling rings; and then the elastic pieces aside the inserting end pass through the buckling ring and resist against the inserting end. Thereby, the plates are combined, while the inserting end can not be released. Therefore, the combining device of the present invention provide a low cost and conventional way for combining a plurality of overlapping plates. Moreover, by the present invention, the combining surface is flat.

The various objects and advantages of the present invention will be more readily understood from the following detailed description when read in conjunction with the appended drawing.

BRIEF DESCRIPTION OF THE DRAWINGS

FIG. 2 is a perspective view of the present invention.

FIG. 3 shows an operation of combining plates by the combining device of the present invention.

DETAILED DESCRIPTION OF THE PREFERRED EMBODIMENTS

Figure 6:
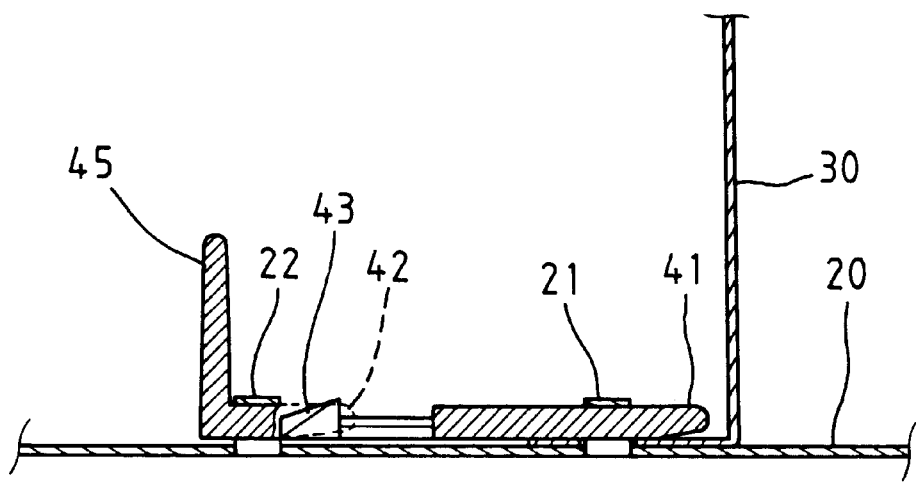
FIG. 6 is a cross section view for overlapping plates by the combining device of the present invention.

Referring to FIG. 2 and FIG. 6, the combining device of the present invention is illustrated. The combining device includes a first plate 20 (see FIG. 6) at the bottom layer (or also called an outer layer), a plurality of upper plates 30 (referring to FIG. 6, only one plate is illustrated in the drawing), and an inserting means 40. The first plate 20 is formed with at least two buckling rings 21, 22 which are arranged longitudinally. A proper distance is retained between the two buckling rings 21, 22.

Figure 4:
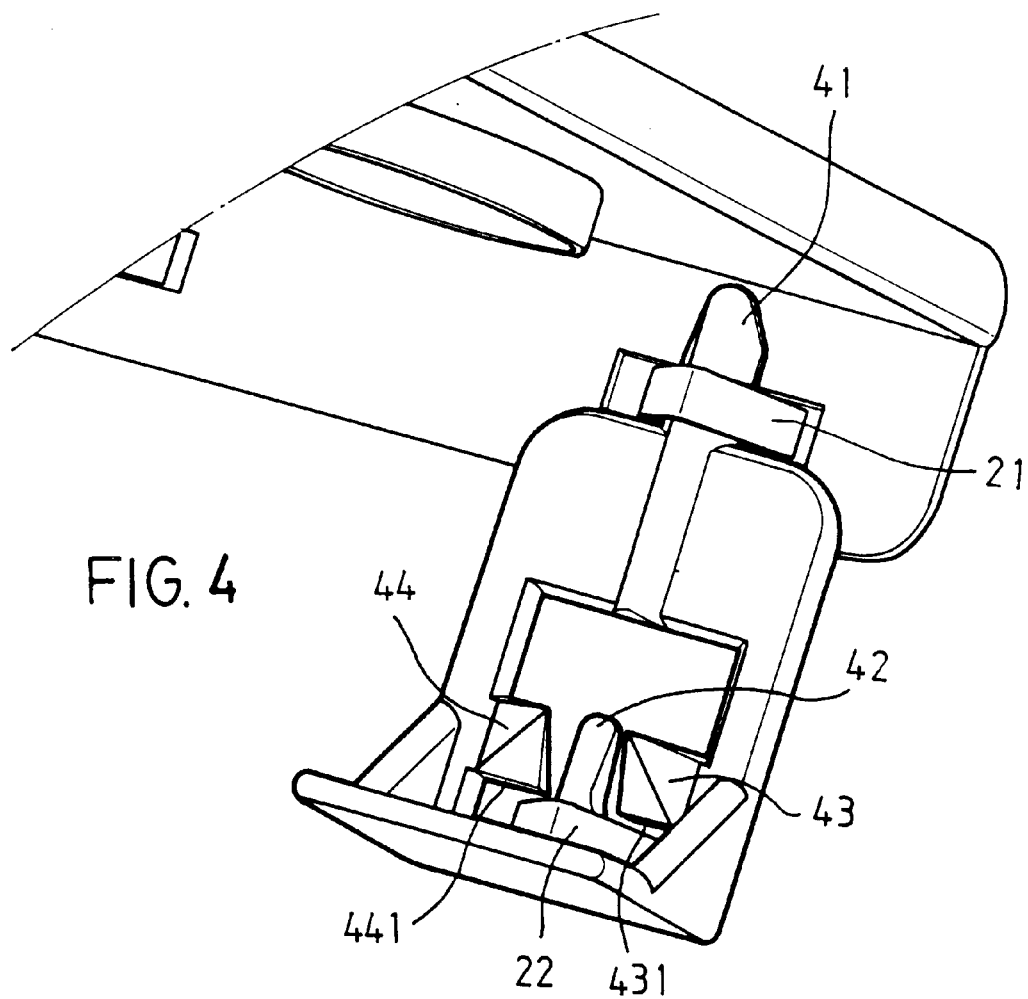
FIG. 4 shows an assembling view of combining plates by the combining device of the present invention.
Figure 1:
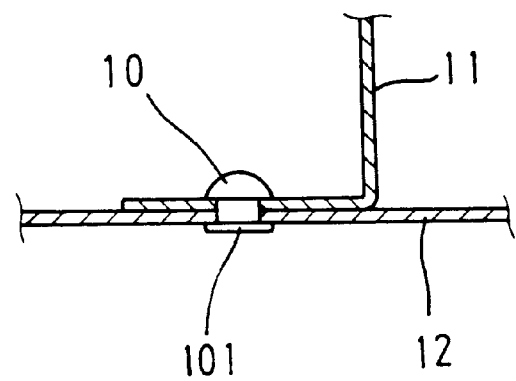
FIG. 1 is a perspective view showing a prior combining device of plates.

Each upper plate 30 is formed with at least one hole 31 at position corresponding to one of the buckling rings 21, 22. The hole 31 is buckled to one of the buckling rings 21, 22. Then, the inserting ends 41, 42 of the inserting means 40 inserts into the buckling rings 21, 22. The elastic pieces 43, 44 aside the inserting end 42 resist against the inserting end 42 (referring to FIG. 4). Thereby, the first plate 20 and the upper plate 30 are combined, while the inserting means 40 can not be released.

Figure 5:
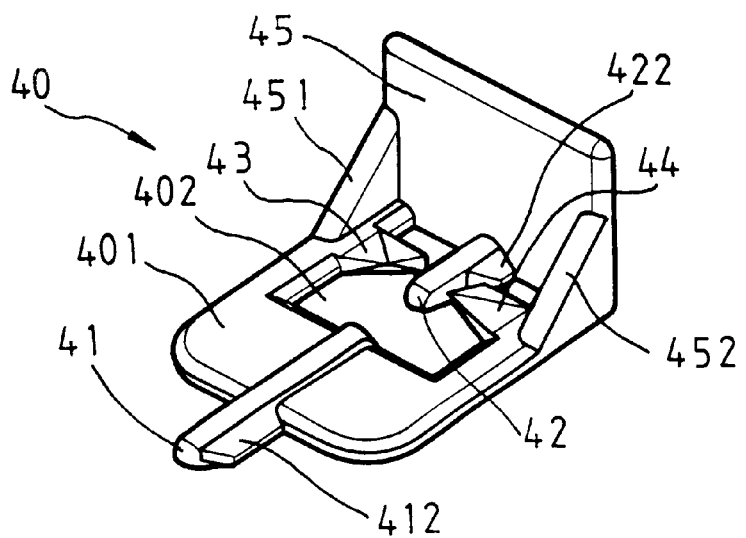
FIG. 5 shows a perspective view of the first embodiment of the inserting means of the combining device in the present invention.

Referring to FIG. 5, the inserting means 40 includes at least one frame 401. A second inserting end 42 extends from a lower edge of the frame 401 and is aligned with the first inserting end 41. The first and second inserting ends 41, 42 point toward the same direction. The frame 401 at the front edge of the second inserting end 42 has a hole 402 which has a size capable of containing the buckling ring 22. Two elastic pieces 43, 44 from the frame 401 pointing to the second inserting end 42 are formed at two sides of the hole 402. The bottoms of two elastic pieces 43, 44 have proper tilt surfaces, thereby, the positioning of the inserting means 40 can be performed successfully. It is preferable that triangular wings at two sides of the resisting plate 45 are used to connect the resisting plate 45 and the frame 401.

FIG. 6 is a cross section view showing the combining device of the present invention being used to combine plates. At first, the buckling ring 22 of the first plate 20 is positioned in the hole 402 of the inserting means 40. The first inserting end 41 points toward another buckling ring 21 for combing the first plate 20 and the upper plate 30 (referring to FIG. 2 and FIG. 3). Then, the user pushes a push plate 45 of the inserting means 40 so that the inserting means slides forwards. After the inserting means slides, the first inserting end 41 will move into the buckling ring 21. At the same time, the two elastic pieces 43, 44 of the inserting means 40 will move through another buckling ring 22 by the tilt surface thereof so that the buckling ring 22 is at a rear side of the two elastic pieces 43, 44. Now, the lower edges 431, 441 of the elastic pieces 43, 44 are used as resisting portions for confining the inserting means (referring to FIG. 4). As a result, the assembly of the first plate 20 and the upper plate 30 are complete.

In above description, it is preferred that the shapes of the buckling rings are triangular shapes which benefit the sliding of the elastic pieces. Similarly, two inserting ends 41, 42 of the inserting means 40 are formed with tilt surfaces 411, 412, 421, and 422 from the top center to the outer sides so that inserting and fixing works may be well performed.

Figure 7:
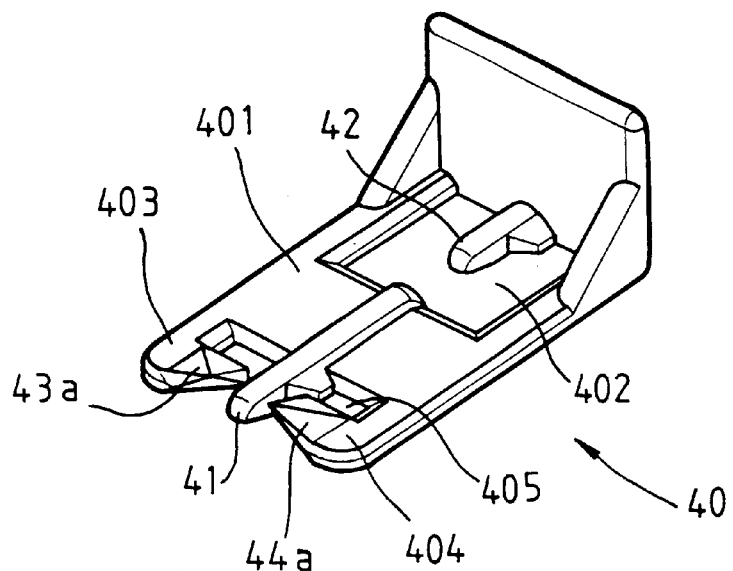
FIG. 7 is a perspective view of the second embodiment of the inserting means in the present invention.

Referring to FIG. 7, another preferred embodiment of the inserting means 40 of the present invention is illustrated. The inserting means 40 includes a frame 401. The front edge of the frame 401 extends with a first inserting end 41. A second inserting end 42 extends from a lower edge of the frame 401 and is aligned with the first inserting end 41. The first and second inserting ends 41, 42 point toward the same direction. The frame 401 at the front edge of the second inserting end 42 has a hole 402 which has a size capable of containing the buckling ring 22. Two extending arms 403, 404 from the front edge of the frame 401 are formed. Each arm has elastic piece 43a, 44a pointing to the first inserting end 41. A space 405 is formed between the elastic pieces 43a and 44a and the frame 401. The space 405 is exactly sufficient to enclose the buckling ring 21. The structure of the elastic pieces are identical to above embodiment, i.e., tilt surfaces are formed at the bottoms thereof so that they may pass through the buckling ring 21 easily.

Figure 8:
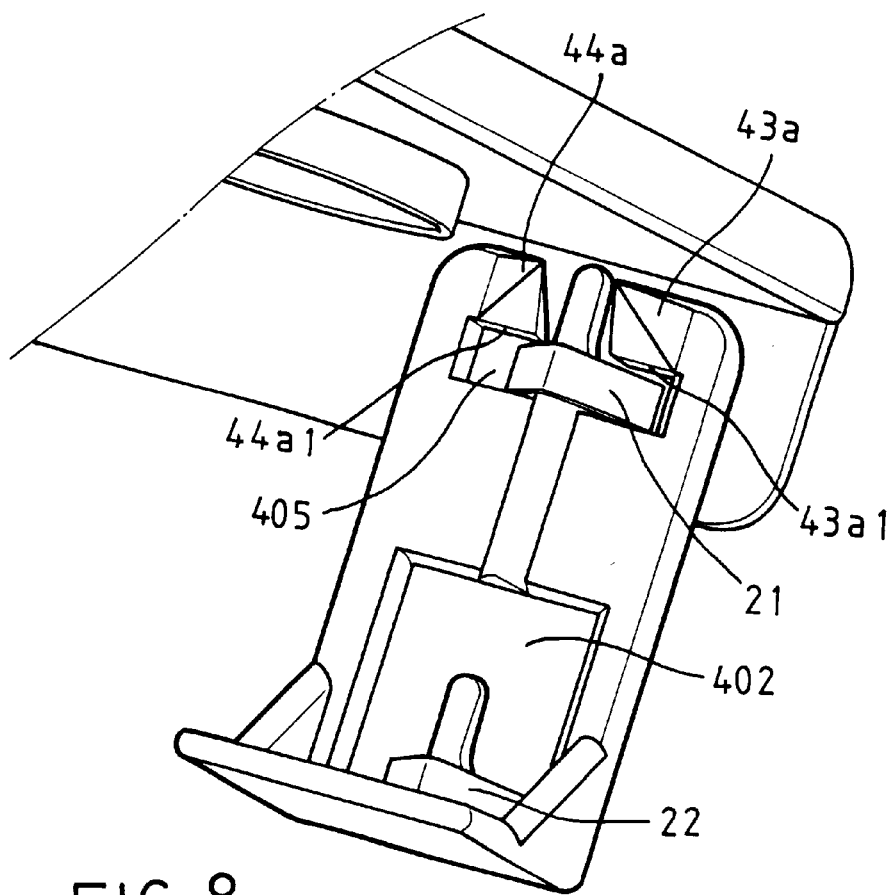
FIG. 8 shows the structure of the inserting means of the combining device of the present invention.

Referring to FIG. 8, by the inserting means 40 of FIG. 7, at first, the buckling ring 22 of the first plate 20 is positioned in the hole 402 of the inserting means 40. Then, the user pushes a push plate 45 of the inserting means 40 so that the inserting means slides forwards. Thus, the second inserting means slides into the buckling ring 22 for being positioned therein. At the same time, the second inserting end 41 passes through another buckling ring 21 by the elastic pieces 43a, 44a at two sides and then inserts into the buckling ring 21. Then, this buckling ring 21 is placed into the space 405 between the elastic pieces 43a and 44a and the frame 401. Thereby, the lower edge 43a1, 44a1 of the elastic pieces 43a, 44a become resisting portions for resisting the buckling ring 21. As a result, the inserting means does not release out from the ring.

Figure 9:
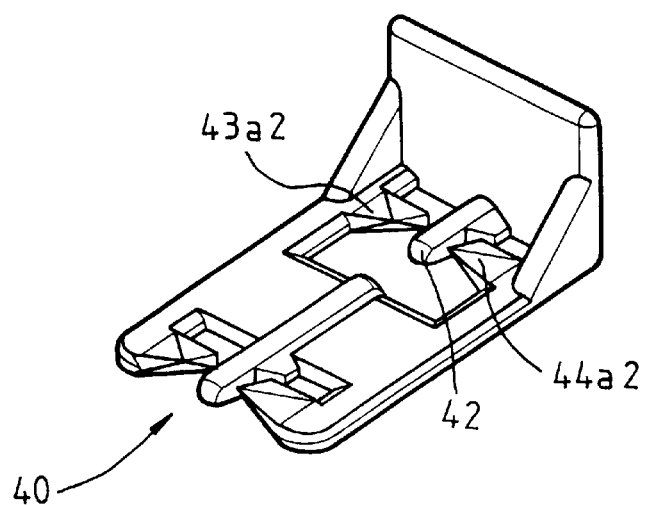
FIG. 9 shows the third embodiment of the inserting means in the combining device of the present invention.
Figure 10:
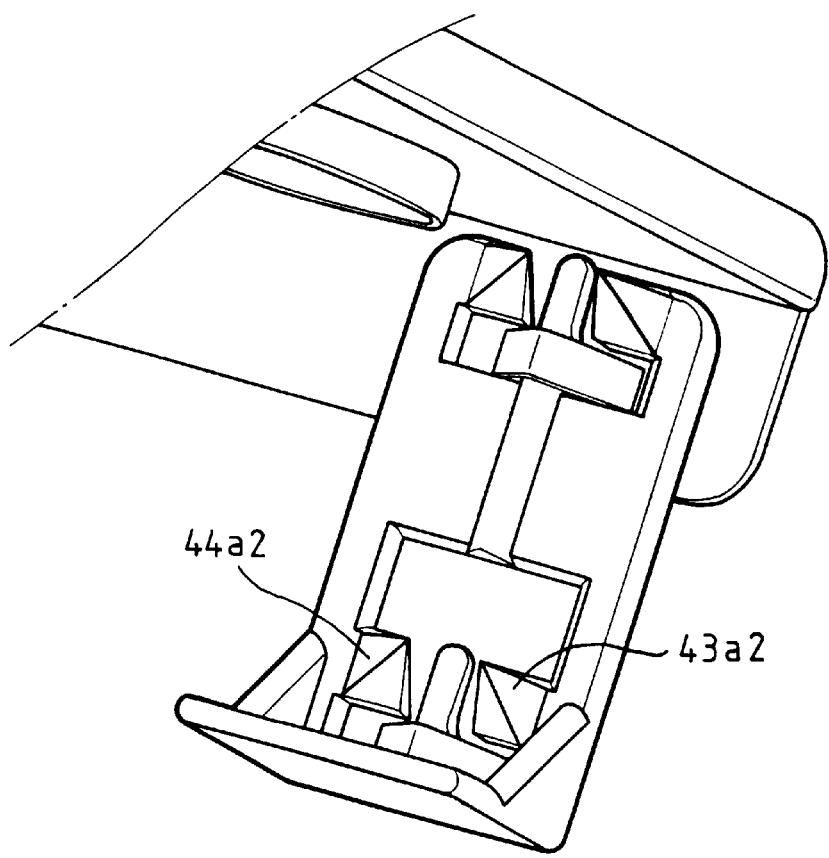
FIG. 10 is a structural view showing the inserting means in FIG. 9.

FIG. 9 shows an embodiment of the inserting means 40. In the inserting means 40 of this embodiment, which is identical to that of FIG. 7, the elastic pieces 43a2, 44a2 pointing to the second inserting end 42 extends from the frame. Thereby, the inserting means 40 has a retaining effect as positioning the first plate 20 and the upper plate 30, as shown in the FIG. 10.

Therefore, the combining device of the present invention improves the defects of the conventional way for combining stacked plates. Furthermore, the cost of the present invention is low and the present invention can be assembled easily. Moreover, by the present invention, the combining surface is flat.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A combining device for combining stacked plates comprising:

a first plate as a bottom layer of the combining device and the first plate having at least two buckling rings; a predetermined distance being retained between the two buckling rings;

at least one upper plate having at least two plate holes each at a position corresponding to a respective one of the buckling rings; and an inserting means comprising:
   at least one frame;
   a first inserting end extending from a front edge of the at least one frame;
   a frame hole being formed in the frame; and a size of the frame hole being capable of receiving any one of the at least two buckling rings;
   a second inserting end being extended from an edge of the frame hole; the second inserting end being aligned with the first inserting end; and the first and second inserting ends being oriented at the same direction; and
   each of two opposite sides of the frame hole having an elastic piece which extends from one edge of the frame hole toward the second inserting end;
   wherein in assembly, the first inserting end and the second inserting end of the inserting means are inserted into the buckling rings, respectively; then the inserting means moves continuously, so that two elastic pieces aside the second inserting end run over a respective one of the at least two buckling rings by its elasticity and finally resist against the respective one of the buckling ring so that the respective buckling ring are disposed between the two elastic piece and one edge of the frame; thereby, the plates are combined, while the first and second inserting ends are fixed therein.

2. The combining device for combining stacked plates as claimed in claim 1, wherein a bottom of each elastic piece has an inclined surface.

3. The combining device for combining stacked plates as claimed in claim 1, wherein a lower edge of the frame is extended with a resisting plate.

4. The combining device for combining stacked plates as claimed in claim 3, wherein each of two sides of the resisting plate has a respective triangular wing for connecting the resisting plate to the frame.

* * * * *